(12) United States Patent
Frankel et al.

(10) Patent No.: US 7,529,653 B2
(45) Date of Patent: May 5, 2009

(54) MESSAGE PACKET LOGGING IN A DISTRIBUTED SIMULATION SYSTEM

(75) Inventors: Carl B. Frankel, San Francisco, CA (US); Steven A. Sivier, Fremont, CA (US); James P. Freyensee, Los Altos, CA (US); Carl Cavanagh, Oakland, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1917 days.

(21) Appl. No.: 10/007,816

(22) Filed: Nov. 9, 2001

(65) Prior Publication Data

US 2003/0093252 A1 May 15, 2003

(51) Int. Cl.
G06G 7/62 (2006.01)
G06G 7/48 (2006.01)

(52) U.S. Cl. ............................................. 703/13; 703/7
(58) Field of Classification Search .................. 703/13, 703/7
See application file for complete search history.

(56) References Cited

U.S. PATENT DOCUMENTS

| | | | |
|---|---|---|---|
| 4,456,994 A | 6/1984 | Segarra | |
| 4,590,581 A * | 5/1986 | Widdoes, Jr. .................. | 703/2 |
| 4,821,173 A | 4/1989 | Young et al. | |
| 4,937,173 A | 6/1990 | Kanda et al. | |
| 5,185,865 A | 2/1993 | Pugh | |
| 5,247,650 A * | 9/1993 | Judd et al. .................... | 703/20 |
| 5,327,361 A | 7/1994 | Long et al. | |
| 5,339,435 A | 8/1994 | Lukin et al. | |
| 5,398,317 A | 3/1995 | Nugent | |
| 5,442,772 A | 8/1995 | Childs et al. | |
| 5,455,928 A | 10/1995 | Herlitz | |
| 5,466,200 A * | 11/1995 | Ulrich et al. ................... | 482/4 |
| 5,519,848 A | 5/1996 | Wloka et al. | |
| 5,625,580 A | 4/1997 | Read et al. | |
| 5,634,010 A | 5/1997 | Ciscon et al. | |
| 5,715,184 A | 2/1998 | Tyler et al. | |
| 5,732,247 A | 3/1998 | Dearth et al. | |
| 5,751,941 A | 5/1998 | Hinds et al. | |
| 5,794,005 A | 8/1998 | Steinman | |
| 5,812,824 A | 9/1998 | Dearth et al. | |
| 5,838,948 A * | 11/1998 | Bunza .......................... | 703/27 |
| 5,848,236 A | 12/1998 | Dearth et al. | |
| 5,850,345 A | 12/1998 | Son | |
| 5,870,585 A | 2/1999 | Stapleton | |

(Continued)

OTHER PUBLICATIONS

Damani, Om et al, Fault-Tolerant Distributed Simulation, May 1998, Univ. Texas.*

(Continued)

*Primary Examiner*—Kamini S Shah
*Assistant Examiner*—David Silver
(74) *Attorney, Agent, or Firm*—Lawrence J. Merkel; Meyertons, Hood, Kivlin, Kowert & Goetzel, P.C.

(57) ABSTRACT

A distributed simulation system may include a plurality of nodes arranged to perform a simulation of a system under test. The plurality of nodes are configured to communicate simulation commands and signal values for the system under test using message packets transmitted between the plurality of nodes. At least one of the plurality of nodes is configured to log the message packets in one or more log files during the simulation.

25 Claims, 10 Drawing Sheets

U.S. PATENT DOCUMENTS

| | | | |
|---|---|---|---|
| 5,875,179 | A | 2/1999 | Tikalsky |
| 5,881,267 | A | 3/1999 | Dearth et al. |
| 5,889,954 | A * | 3/1999 | Gessel et al. ............... 709/223 |
| 5,892,957 | A | 4/1999 | Normoyle et al. |
| 5,893,155 | A * | 4/1999 | Cheriton ..................... 711/144 |
| 5,907,685 | A | 5/1999 | Douceur |
| 5,907,695 | A | 5/1999 | Dearth |
| 5,910,903 | A | 6/1999 | Feinberg et al. |
| 5,973,638 | A * | 10/1999 | Robbins et al. ............. 342/172 |
| 5,991,533 | A | 11/1999 | Sano et al. |
| 6,031,987 | A * | 2/2000 | Damani et al. ................ 703/17 |
| 6,053,947 | A | 4/2000 | Parson |
| 6,117,181 | A | 9/2000 | Dearth et al. |
| 6,134,234 | A | 10/2000 | Kapanen |
| 6,289,398 | B1 * | 9/2001 | Stallmo et al. ................ 710/5 |
| 6,345,242 | B1 | 2/2002 | Dearth et al. |
| 6,507,809 | B1 | 1/2003 | Yoshino et al. |
| 6,711,411 | B1 | 3/2004 | Ruffini |
| 6,748,451 | B2 | 6/2004 | Woods et al. |

OTHER PUBLICATIONS

Tay, Seng Chuan et al, Speculative Parallel Simulation with an Adaptive Throttle Scheme, 1997, IEEE, 116-122+.*

Preiss, Bruno,"The Yaddes Distributed Discrete Event Simulation Specification Language and Execution Environments", 1989, p. 1-24.*

TFHRC.gov, "Developing a Verifiable System", 1998, http://web.archive.org/web/19980205012202/http://tfhrc.gov/advanc/vve/vve2.htm.*

ANL.gov, "Modular Design Review", 1995, http://www-unix.mcs.anl.gov/dbpp/text/node40.html.*

Jerry Banks, ed.; Handbook of Simulation; 1998; John Wiley & Sons, Inc.; pp. 3-51.

Robert W. Sebesta, Concepts of Programming Language, 1999 Addison Wesley L9ongman, Inc., Fourth Edition, pp. 105-131.

Lee, K.C., "A Virtual Bus Architecture for Dynamic Parallel Processing Parallel and Distributed Systems," IEEE Transactions, vol. 4, Issue 2, Feb. 1993, pp. 121-130.

Lee, K.C., A Virtual Bus for Dynamic Parallel Processing Parallel and Distributed Processing, 1990, Proceedings of the Second IEEE Symposium on Dec. 9-13, 1990, pp. 736-743.

"Rule Base Driven Conversion of an Object Oriented Design Structure Into Standard Hardware Description Languages," Verschueren, A.C., IEEE Xplore, appears in Euromicro Conference, 1998, Proceedings. 24th, vol. 1, Aug. 25, 1998, pp. 42-45.

"Modeling Communication with Objective VHDL," Putzke, et al., IEEE Xplore, appears in Verilog HDL Conference and VHDL International Use Forum, 1998, IVC/VIUF, Proceedings., 1998 International, Mar. 16, 1998, pp. 83-89.

"A Procedural Language Interface for VHDL and its Typical Applications," Martinolle, et al., IEEE Xplore, appears in Verilog HDL Conference and VHDL International Use Forum, 1998, IVC/VIUF, Proceedings., 1998 International, Mar. 16, 1998, pp. 32-38.

"The Verilog Procedural Interface for the Verilog Hardware Description Language," Dawson, et al., IEEE Xplore, appears in Verilog HDL Conference, 1996, Proceedings., 1996 International, Feb. 26, 1996, pp. 17-23.

"An Integrated Environment for HDL Verification," York, et al., IEEE Xplore, appears in Verilog HDL Conference, 1995, Proceedings., 1995 International, Mar. 27, 1995, pp. 9-18.

"The PowerPC 603 C++ Verilog Interface Model," Voith, R.P., IEEE Xplore, appears in Compcon Spring '94, Digest of Papters, Feb. 28, 1994, pp. 337-340.

Networked Object Oriented Verification with C++ and Verilog, Dearth, et al., IEEE, XP-002144328, 1998, 4 pages.

Patent Abstracts of Japan, publication No. 10326835, published Dec. 8, 1998.

Patent Abstracts of Japan, publication No. 10049560, published Feb. 20, 1998.

Patent Abstracts of Japan, publication No. 10340283, published Dec. 22, 1998.

Patent Abstracts of Japan, publication No. 07254008, published Oct. 3, 1995.

"Multiprocessing Verilog Simulator Exploits the Parallel Nature of HDLs." Lisa Maliniak, Electronic Design, Abstract, May 30, 1994, 1 page.

"It's A Multithreaded World, Part I," Charles J. Northrup, BYTE, May 1992, 7 pages.

"It's a Multithreaded World, Part 2," Charles J. Northrup, BYTE, Jun. 1992, pp. 351-356.

"Weaving a Thread," Shashi Prasad, BYTE, Oct. 1995, pp. 173-174.

"Making Sense of Collaborative Computing," Mark Gibbs, Network World Collaboration, Jan. 10, 1994, 4 pages.

"Parallel Logic Simulation of VLSI Systems," Bailey, et al., ACM Computing Surveys, vol. 26, No. 3, Sep. 1994, pp. 255-294.

"Multithreaded Languages for Scientific and Technical Computing," Cherri M. Pancake, Proceedings of the IEEE, vol. 81, No. 2, Feb. 1993, pp. 288-304.

"Distributed Simulation Architecture, SW Environment, Enterprise Server Products," Purdue EE400 Presentation by Freyensee and Frankel, Nov. 9, 2000, 13 pages.

"BNF and EBNF: What Are They And How Do They Work?," Lars Marius Garshol, Oct. 12, 1999, pp. 1-10.

"VCK: Verilog-C Kernel," Testbench Automation, Distributed by Verilog Simulation, Hardware-Software Co-verification, 2001 Avery Design Systems, Inc., 8 pages.

"Principles of Verilog PLI," Swapnajit Mittra, Silicon Graphics Incorporated, 1999, 10 pages.

"IEEE Standard Hardware Description Language Based on the Verilog® Hardware Description Language," IEEE, Dec. 12, 1995, 8 pages.

"OpenVera 1.0, Language Reference Manual," Version 1.0, Mar. 2001, pp. 4-1 to 4-34, pp. 5-1 to 5-32, 6-1 to 6-22, 7-1 to 7-24, 11-1 to 11-50, 12-1 to 12-8, 13-1 to 13-14, 14-1 to 14-20, 15-1 to 15-118.

"VLSI Designe of a Bust Arbitration Module for the 68000 Series of Microprocessors," Ososanya, et al., IEEE, 1994, pp. 398-402.

"A VHDL Standard Package for Logic Modeling," David R. Coelho, IEEE Design & Test of Computers, vol. 7, Issue 3, Jun. 1990, pp. 25-32.

"Corrected Settling Time of the Distributed Parallel Arbiter," M.M. Taub, PhD., IEEE Proceedings, Part E: Computers & Digitals, vol. 139, Issue 4, Jul. 1992, pp. 348-354.

* cited by examiner

| | Log 14 |
|---|---|
| Time Stamp    Source Model, Destination Model    Message Packet | |
| Time Stamp    Source Model, Destination Model    Message Packet | |
| Time Stamp    Source Model, Destination Model    Message Packet | |
| Time Stamp    Source Model, Destination Model    Message Packet | |
| ⋮ | |

*Fig. 4*

| | | Log 14 |
|---|---|---|
| Time Stamp | Source Model, Destination Model | Message Packet |
| Time Stamp | Source Model, Destination Model | Message Packet |
| Time Stamp | Source Model, Destination Model | Message Packet |
| Time Stamp | Source Model, Destination Model | Message Packet |
| Time Stamp | Checkpoint Reference | |
| Time Stamp | Source Model, Destination Model | Message Packet |
| Time Stamp | Source Model, Destination Model | Message Packet |

MESSAGE PACKET LOGGING IN A DISTRIBUTED SIMULATION SYSTEM

BACKGROUND OF THE INVENTION

1. Field of the Invention

This invention is related to the field of distributed simulation systems and, more particularly, to logging of message packets in distributed simulation systems.

2. Description of the Related Art

Generally, the development of components for an electronic system such as a computer system includes simulation of models of the components. In the simulation, the specified functions of each component may be tested and, when incorrect operation (a bug) is detected, the model of the component may be changed to generate correct operation. Once simulation testing is complete, the model may be fabricated to produce the corresponding component. Since many of the bugs may have been detected in simulation, the component may be more likely to operate as specified and the number of revisions to hardware may be reduced. The models are frequently described in a hardware description language (HDL) such as Verilog, VHDL, etc. The HDL model may be simulated in a simulator designed for the HDL, and may also be synthesized, in some cases, to produce a netlist and ultimately a mask set for fabricating an integrated circuit.

Originally, simulations of electronic systems were performed on a single computing system. However, as the electronic systems (and the components forming systems) have grown larger and more complex, single-system simulation has become less desirable. The speed of the simulation (in cycles of the electronic system per second) may be reduced due to the larger number of gates in the model which require evaluation. Additionally, the speed may be reduced as the size of the electronic system model and the computer code to perform the simulation may exceed the memory capacity of the single system. In some cases, the simulators may not be capable of simulating the entire model. As the speed of the simulation decreases, simulation throughput is reduced.

To address some of these issues, distributed simulation has become more common. Generally, a distributed simulation system includes two or more computer systems simulating portions of the electronic system in parallel. Each computer system must communicate with other computer systems simulating portions of the electronic system to which the portion being simulated on that computer system communicates, to pass signal values of the signals which communicate between the portions.

Distributed simulation systems may be susceptible to additional risks that may affect completion of the simulation. For example, since two or more computer systems are used, the systems communicate with each other (e.g. over a network). Thus, the simulation may be prevented from completing due to network outages or communication breakdowns. Furthermore, if any of the computer systems involved in the simulation experiences a crash, the simulation may be prevented from completing. In single image simulations, the simulation may be prevented from completing only if the computer system on which the single image is executing experiences a crash.

SUMMARY OF THE INVENTION

A distributed simulation system may include a plurality of nodes arranged to perform a simulation of a system under test. The plurality of nodes are configured to communicate simulation commands and signal values for the system under test using message packets transmitted between the plurality of nodes. At least one of the plurality of nodes is configured to log the message packets in one or more log files during the simulation.

BRIEF DESCRIPTION OF THE DRAWINGS

The following detailed description makes reference to the accompanying drawings, which are now briefly described.

FIG. 4 is a block diagram illustrating one embodiment of a log file.

FIG. 8 is a block diagram of a second embodiment of a log file.

Figure 1:
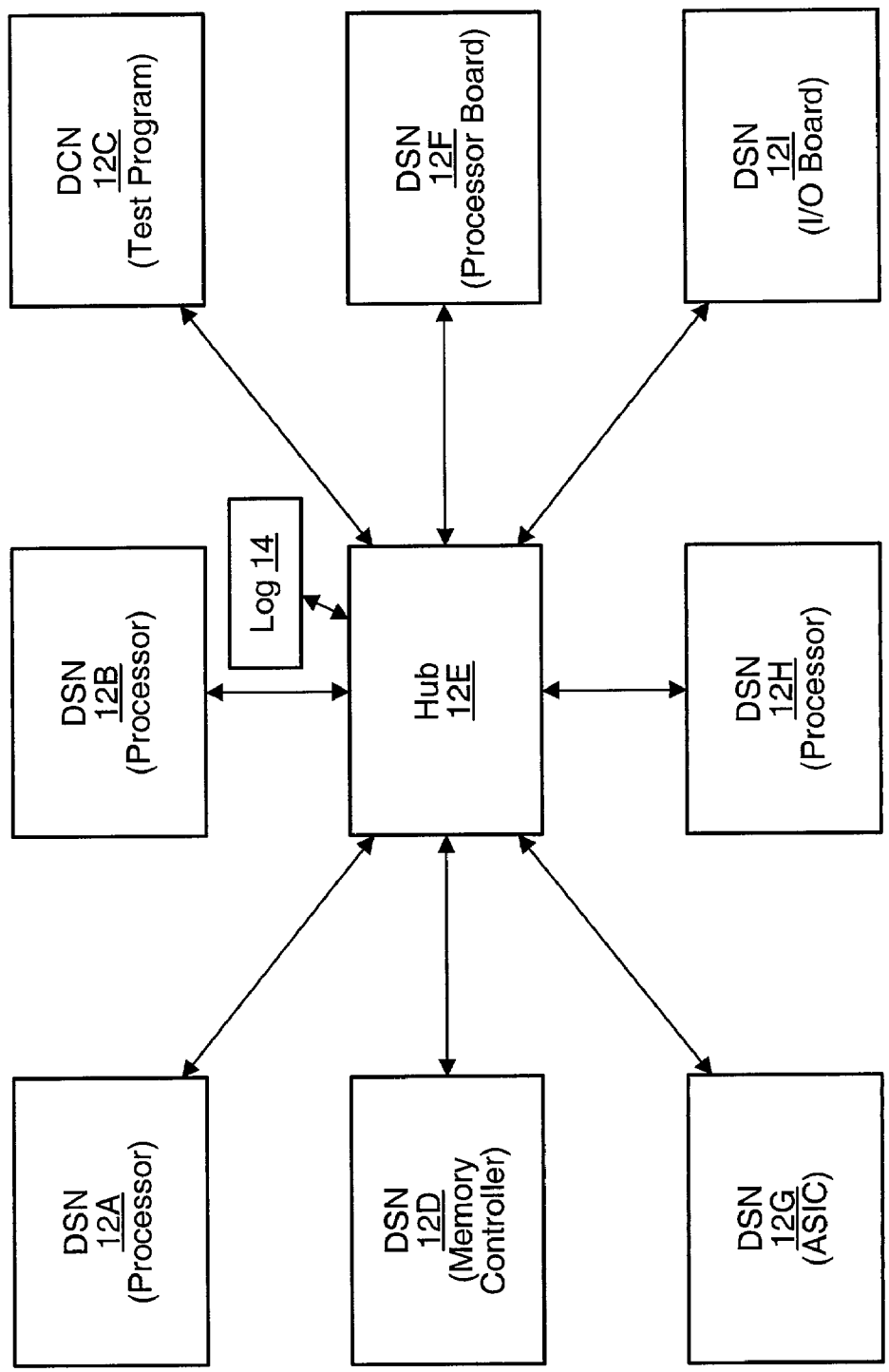
FIG. 1 is a block diagram of one embodiment of a distributed simulation system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

In the discussion below, both the computer systems comprising the distributed simulation system (that is, the computer systems on which the simulation is being executed) and the electronic system being simulated are referred to. Generally, the electronic system being simulated will be referred to as the "system under test".

Turning now to FIG. 1, a block diagram of one embodiment of a distributed simulation system 10 is shown. Other embodiments are possible and contemplated. In the embodiment of FIG. 1, the system 10 includes a plurality of nodes 12A-12I and a log file 14. Each node 12A-12D and 12F-12I is coupled to communicate with at least node 12E (which is the hub of the distributed simulation system). Nodes 12A-12B, 12D, and 12F-12I are distributed simulation nodes (DSNs), while node 12C is a distributed control node (DCN).

Generally, a node is the hardware and software resources for: (i) simulating a component of the system under test; or (ii) running a test program or other code (e.g. the hub) for controlling or monitoring the simulation. A node may include one or more of: a computer system (e.g. a server or a desktop computer system), one or more processors within a computer system (and some amount of system memory allocated to the one or more processors) where other processors within the computer system may be used as another node or for some other purpose, etc. The interconnection between the nodes illustrated in FIG. 1 may therefore be a logical interconnection. For example, in one implementation, Unix sockets are created between the nodes for communication. Other embodiments may use other logical interconnection (e.g. remote procedure calls, defined application programming interfaces (APIs), shared memory, pipes, etc.). The physical interconnection between the nodes may vary. For example, the computer systems including the nodes may be networked using any network topology. Nodes operating on the same computer system may physically be interconnected according to the design of that computer system.

A DSN is a node which is simulating a component of the system under test. A component may be any portion of the system under test. For example, the embodiment illustrated in FIG. 1 may be simulating a computer system, and thus the DSNs may be simulating processors (e.g. nodes 12A-12B and 12H), a processor board on which one or more of the processors may physically be mounted in the system under test (e.g. node 12F), an input/output (I/O) board comprising input/output devices (e.g. node 12I), an application specific integrated circuit (ASIC) which may be mounted on a processor board, a main board of the system under test, the I/O board, etc. (e.g. node 12G), a memory controller which may also be mounted on a processor board, a main board of the system under test, the I/O board, etc. (e.g. node 12D).

Depending on the configuration of the system under test, various DSNs may communicate. For example, if the processor being simulated on DSN 12A is mounted on the processor board being simulated on DSN 12F in the system under test, then input/output signals of the processor may be connected to output/input signals of the board. If the processor drives a signal on the board, then a communication between DSN 12A and DSN 12F may be used to provide the signal value being driven (and optionally a strength of the signal, in some embodiments). Additionally, if the processor being simulated on DSN 12A communicates with the memory controller being simulated on DSN 12D, then DSNs 12A and 12D may communicate signal values/strengths.

A DSN may include any simulator and a model of the portion of the system under test simulated in that node. For example, event-driven simulators may be used. Alternatively, cycle-based simulators may be used. Exemplary simulators may include the VCS simulator from Synopsys, Inc. (Mountain View, Calif.); the NCVerilog simulator from Cadence Design Systems, Inc. (San Jose, Calif.); the VerilogXL simulator from Cadence; or the SystemSim program from Co-Design Automation, Inc. of Los Altos, Calif., or any other simulator may be used. The model may be coded in any HDL (e.g. Verilog, VHDL, etc.) supported by the simulators used. The DSNs may further include control code used to interface with other nodes, to control the simulation within the node, etc.

A DCN is a node which is executing a test program or other code which is not part of the system under test, but instead is used to control the simulation, introduce some test value or values into the system under test (e.g. injecting an error on a signal), monitor the simulation for certain expected results or to log the simulation results, etc.

A DCN may communicate with a DSN to provide a test value, to request a value of a physical signal or other hardware modeled in the component simulated in the DSN or a facility of the model, to communicate commands to the simulator in the DSN to control the simulation, etc.

The hub (e.g. node 12E in FIG. 1) is provided for routing communications between the various other nodes in the distributed simulation system. Each DSN or DCN transmits message packets to the hub, which parses the message packets and forwards message packets to the destination node or nodes for the message. Additionally, the hub may be the destination for some message packets (e.g. for synchronizing the simulation across the multiple DSNs and DCNs).

As mentioned above, the communication between the nodes 12A-12I may be in the form of message packets. The format and interpretation of the message packets is specified by a grammar implemented by the nodes 12A-12I. The grammar is a language comprising predefined commands for communicating between nodes, providing for command/control message packets for the simulation as well as message packets transmitting signal values (and optionally signal strength information). Message packets transmitting signal values are referred to as signal transmission message packets, and the command in the message packet is referred to as a transmit command. The grammar may allow for more abstract communication between the nodes, allowing for the communication to be more human-readable than the communication of only physical signals and values of those signals between the nodes. As used herein, a physical signal is a signal defined in the simulation model of a given component of the system under test (e.g. a HDL model or some other type of model used to represent the given component). A logical signal is a signal defined using the grammar. Logical signals are mapped to physical signals using one or more grammar commands.

Generally, a message packet is any communication between nodes in the distributed simulation system. The message packet may be encoded in any format (e.g. binary, a string of characters, etc.). Each message packet may include one or more commands. In one embodiment, each message packet may comprise one command. In one specific implementation, the command may comprise a string of one or more characters comprising the name of the command, a separator character (e.g. an open brace in one embodiment, although any character may be used), an optional set of arguments, and a second separator character (e.g. a close brace in one embodiment, although any character may be used) which marks the end of the command. A transmit command may include a source model instance as an argument, as well as a model and port list for the logical port or ports within which signal values are being provided. Other commands may include a stop command for pausing the simulation, a start command for resuming the simulation, a no-operation command (NOP) for simulation synchronization and replying to commands, commands for the hub to synchronize timestep transitions (in event driven simulators, or clock cycles in a cycle-based simulator) and optionally phases in the timestep or clock cycle, etc.

In the embodiment of FIG. 1, the hub 12E is coupled to the log file 14. In the present embodiment, the hub routes message packets from one node to another (and may generate some message packets for, e.g., synchronizing timestep or clock cycle transitions among the distributed nodes). Accordingly, the hub 12E detects all message packets in the present embodiment. The hub 12E logs the message packets in the log file 14, thus creating a record of the communications which occur during a given simulation.

The log file 14 may be used for debugging purposes by a user of the distributed simulation system 10. In embodiments in which the grammar is used, the log file may provide a human-readable transcript of the communications among the nodes. By reviewing the transcript, the user may be able to detect the source of a bug which caused incorrect results in the simulation.

The log file 14 may be used to recover from a failure of a node in the distributed simulation system. As used herein, a node "fails" during a simulation if the node experiences a problem which prevents the node from continuing to participate in the simulation. For example, the node may experience a communication failure within the node or on the network used by the node to communicate with other nodes. Since the node cannot communicate with other nodes, it cannot continue participating in the simulation. As another example, the node itself may crash. The crash may be caused by the node over running the resources allocated to the node, by a bug in the software executing on the node, etc. The node may fail if the computer system on which it is executing is powered off (intentionally or due to a power failure) or if the processes comprising the node are killed on the computer system.

Since the log file 14 logs the communications transmitted to the failing node, the log file 14 may be used to establish a new node and bring the new node to a state corresponding to the current state of the distributed simulation as a whole. In other words, simulation of the portion of the system under test that was being simulated on the failing node may be initialized, and the simulation in the new node may be run (with message packets read from the log file 14 and transmitted to the new node) until the new node is at the same simulation time as the other nodes. The simulation as a whole may then proceed with the new node. The progress made in the simulation prior to the failure of the failing node may be retained, and the simulation may be completed. The log file 14 may be used to emulate the rest of the system under test, with the hub 12E (or some other node such as a DCN) transmitting the message packets read from the log file 14 to the new node at the corresponding simulation times.

The log file 14 may also be used for regression purposes. If a component of the system under test is changed (e.g. the design is changed, or a bug is detected and corrected in the component) and the designer believes that the change should not affect the operation of a given simulation, the log file 14 may be used for regression testing of that component. Rather than running a distributed simulation of the entire system under test, a simulation may be run including a node corresponding to the changed component and a control node (or software operating on the same node) which emulates operation of the rest of the system using the log file 14. Nodes corresponding to the remainder of the system under test may be excluded from the regression. The control node may read message packets from the log file 14 and may transmit the message packets which were transmitted to the node in the original simulation to the node at the corresponding simulation times. The control node may also monitor for receipt, during the regression, of message packets corresponding to message packets transmitted from the node in the original simulation. If message packets are not generated during the regression as indicated in the log file 14, the regression may detect a simulation failure and the results may be analyzed by the user. By regressing the log file 14 against the component which was changed instead of running the entire system under test again, fewer simulation resources (e.g. computer systems, software licenses, etc.) may be consumed for the regression. Regression may also be performed, in some instances, at higher speed than if the entire system under test were regressed. more logical ports and zero or more logical signals in general. Both the logical ports and the logical signals are defined in the POV command. It is noted that the term "port" may be used below instead of "logical port". The term "port" is intended to mean logical port in such contexts.

The DDF command is used to map logical signals (defined in the POV command) to the physical signals which appear in the models of the components of the system under test. In one embodiment, there may be at least one DDF command for each component in the system under test.

The SCF command is used to instantiate the components of the system under test and to connect the logical ports of the various components of the system under test. The SCF command may be used by the hub for routing signal transmission message packets from one node to another.

While the embodiment shown in FIG. 1 includes a node operating as a hub (node 12E), other embodiments may not employ a hub. For example, DSNs and DCNs may each be coupled to the others to directly send commands to each other. Alternatively, a daisy chain or ring connection between nodes may be used (where a command from one node to another may pass through the nodes coupled therebetween). In some embodiments including a hub, the hub may comprise multiple nodes. Each hub node may be coupled to one or more DSN/DCNs and one or more other hub nodes (e.g. in a star configuration among the hub nodes). In such embodiments, one hub node may be assigned the task of logging message packets, or each hub node may log. In some embodiments, a DCN or DSN may comprise multiple nodes.

While the present embodiment describes the usage of logical signals defined in the POV and DDF commands, other embodiments may employ physical signals in the communications between nodes, as desired.

It is noted that, while a log file 14 is shown in FIG. 1, the log file may actually be divided into multiple physical files, if desired. For example, the files may periodically be closed and new files may be opened. Such activity may manage the size of any individual file. Additionally, such activity may increase the likelihood, in the event of a failure of the hub node, (which may corrupt files open in the hub such as the log file 14), that most of the log is not corrupted.

Figure 2:
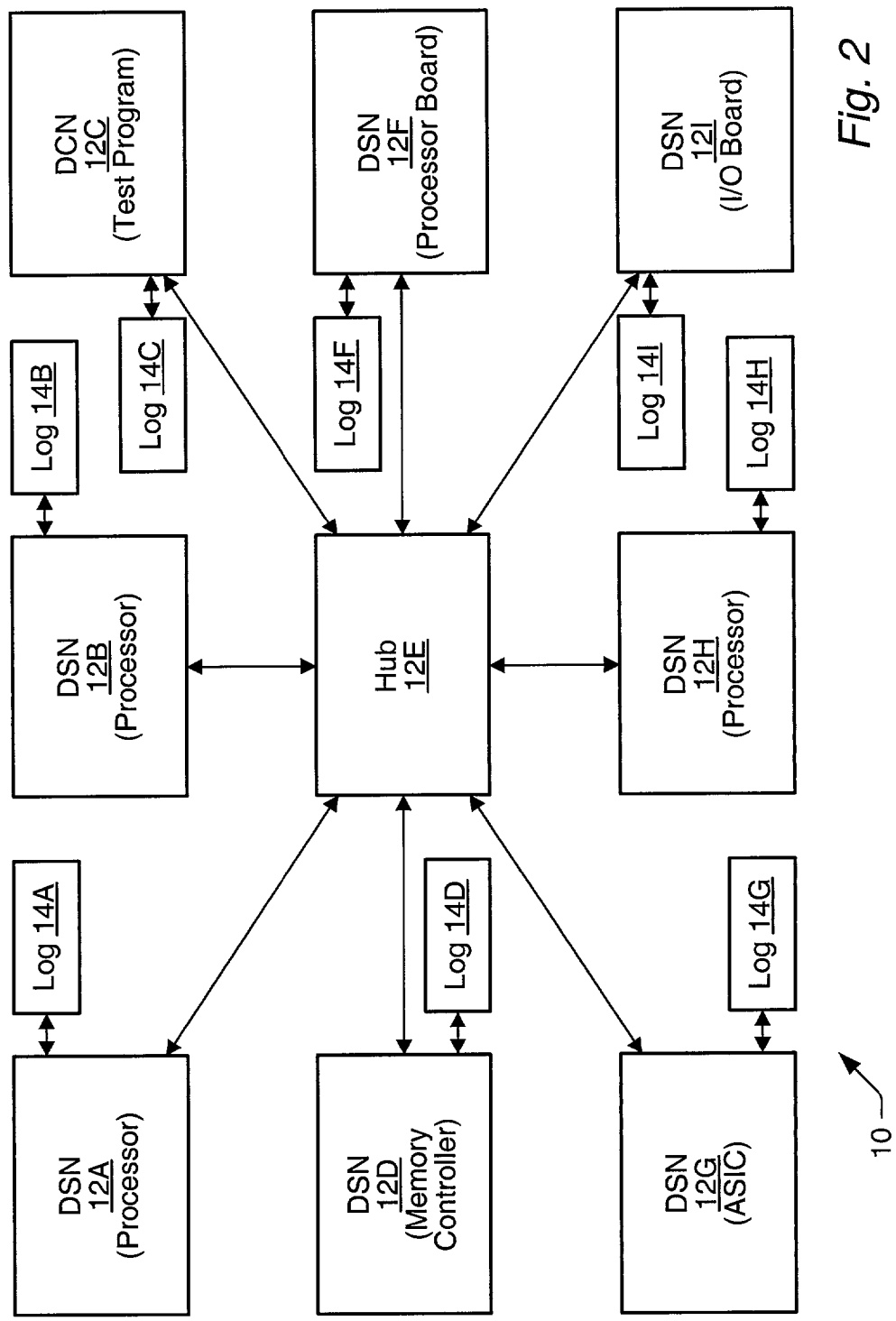
FIG. 2 is a block diagram of a second embodiment of a distributed simulation system.

While the hub 12E logs the message packets in the embodiment of FIG. 1, other embodiments are contemplated. Logging the message packets at the hub provides a single log file source for the distributed simulation. In other embodiments, each node may log the message packets received and transmitted by that node. In such an embodiment, the impact of logging the message packets may be spread among the various nodes. For example, FIG. 2 illustrates an embodiment of the distributed simulation system 10 in which each node logs message packets. In FIG. 2, the DSN 12A is coupled to a log file 14A in which the DSN 12A logs the message packets transmitted to and transmitted by the DSN 12A. Similarly, the DSN 12B is coupled to a log file 14B, the DCN 12C is coupled to a log file 14C, the DSN 12D is coupled to a log file 14D, the DSN 12F is coupled to a log file 14F, the DSN 12G is coupled to a log file 14G, the DSN 12H is coupled to a log file 14H, and the DSN 12I is coupled to the log file 14I. In other embodiments, the hub 12E may also be coupled to a log file as well.

Collectively, the log files 14A-14D and 14F-14I may represent a log of the message packets transmitted during a simulation. As a whole, the log files 14A-14D and 14F-14I may include the same information as the log file 14 in the embodiment of FIG. 1. If desired, a post-processing tool may be used after the simulation is complete to merge the contents of the log files 14A-14D and 14F-14I (eliminating redundant entries) to create a log file similar to the log file 14 of FIG. 1. Additionally, an individual log file may be used for regression testing (e.g. the log file 14A may be used for regression testing of the DSN 12A) or for establishing a new node in the event of a node failure (e.g. the log file 14A may be used to establish a new node in the event of a failure of the node 12A).

An embodiment similar to FIG. 2 may be used in embodiments without a hub node. In such embodiments, each node may still log the packets transmitted to and transmitted by that node.

In yet another embodiment, a node other than the hub may be assigned the task of logging the message packets. For example, in FIG. 3, the DCN 12C performs the logging task and thus is coupled to the log file 14. In such embodiments, the hub 12E may route all message packets to the logging node, even message packets not otherwise destined for the logging node. The logging node may thus log each message packet in the log file 14. The node may be a special purpose logger (e.g. the node may perform no other simulation function), or may also perform other simulation functions (e.g. control, monitoring, etc.). An embodiment similar to FIG. 3 may be used in hubless distributed simulation systems (e.g. one node in the daisy chain may log all packets passed around the ring). Additionally, in embodiments including a hub, the logging node may also have separate communication connections to the other nodes (e.g. separate sockets, shared memory, pipes, APIs, etc.).

Figure 3:
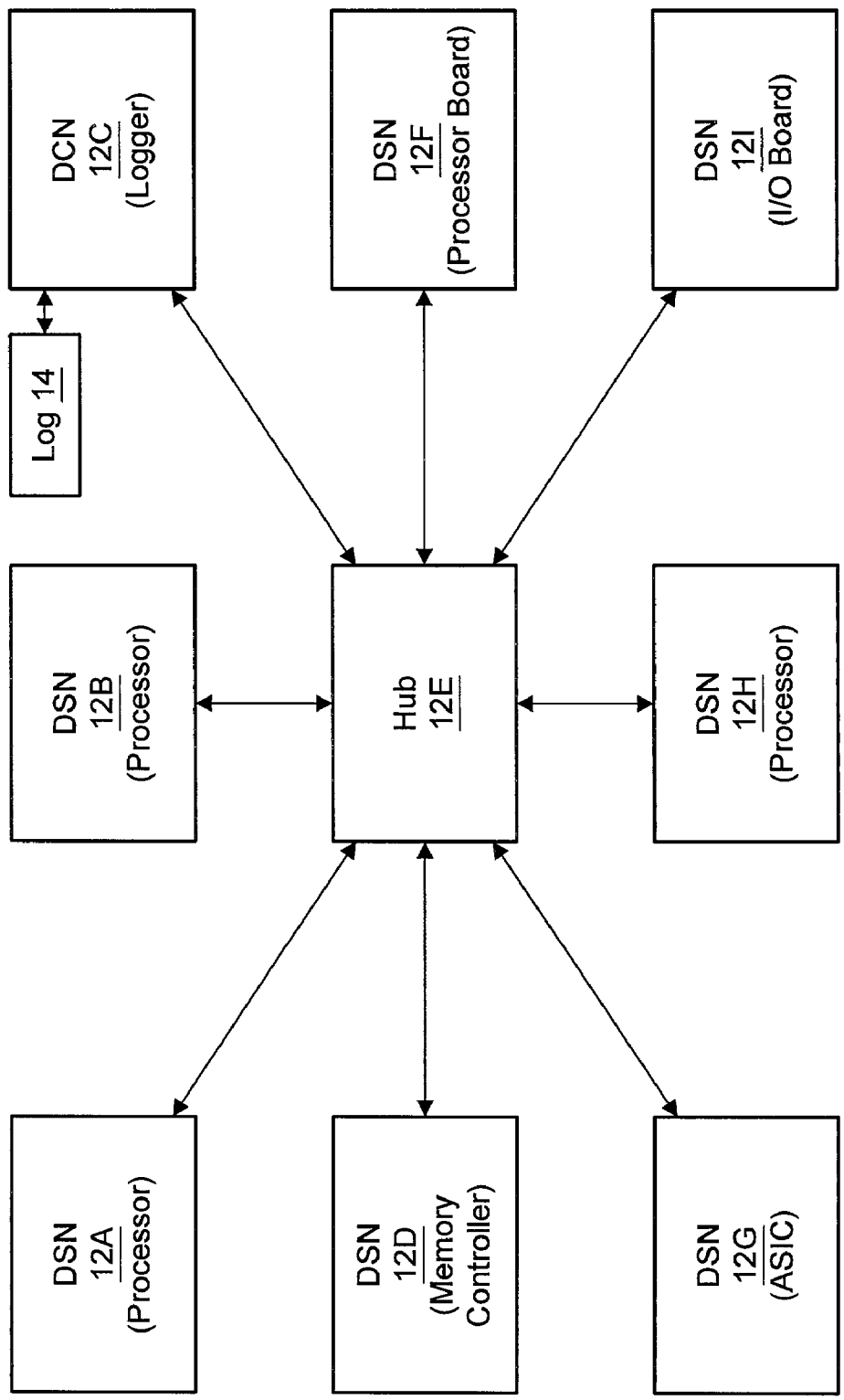
FIG. 3 is a block diagram of a third embodiment of a distributed simulation system.

It is noted that, while the log files in FIGS. 1-3 are illustrated as separate from the nodes that write to them, the log files may generally be part of the node that writes the file. Alternatively, a separate storage (e.g. a network attached storage) may be used to store the log files.

It is noted that, while various embodiments are described herein as logging message packets to the log file, the message packets may actually be buffered in memory and written to the log file as a larger block. In embodiments in which the hub performs the logging, the buffering may allow the hub to defer the longer-latency disk write until a lull in the message packet traffic occurs, thus limiting the impact of the logging on the routing of message packets by the hub.

Turning now to FIG. 4, a block diagram of one embodiment of the log file 14 is shown. The log files 14A-14D and 14F-14I may be similar. Other embodiments are possible and contemplated. In the embodiment of FIG. 4, the log file 14 may include an entry for each message packet transmitted during the simulation. The entry may include a time stamp, which may identify the simulation time at which the message packet is transmitted. The entry may also include the message packet (Message Packet in FIG. 4), and may optionally include source node and/or destination node information for the message packet.

The time stamp may be any indication of simulation time. For example, in event driven simulation, simulation time is typically divided into fixed-sized timesteps. The time stamp may indicate the timestep number (e.g. the first timestep in the simulation may be timestep number zero, the second timestep may be timestep number one, etc.; or alternatively the first timestep may be timestep number one, the second timestep may be timestep number two, etc.). In cycle-based simulation, the time stamp may be the clock cycle number (with the first clock cycle in the simulation being clock cycle number zero or number one, as desired, and subsequent clock cycles in increasing numerical order). The time stamp could be the simulation time itself, if time is kept in a continuous manner in the simulation. The time stamp may be optional. For example, in some embodiments, each message packet may itself include a time stamp, in which case no separate time stamp may be included.

The logging node may write the message packet, as transmitted, into the entry, in one embodiment. In other words, the logging node may not modify the message packet for writing into the entry. The message packets may be formatted according to the grammar, and thus may be human-readable. In embodiments in which the message packets are not human-readable, the logging node may interpret the packet to write a human-readable entry, if desired. Alternatively, the logging node may write the packet as received in these embodiments as well.

The message packet may include an indication of the source node, and may in some cases indicate the destination node as well. For example, each node may be assigned a model name indicating the model that is being simulated in that node (or naming the node, for a DCN). Alternatively, if a message packet does not include a source node indication and/or a destination node indication, the logging node may include such information in the log file entry in addition to the message packet. Such information may increase the readability of the log file and/or may provide information for recovering from a failing node or regression testing.

Figure 5:
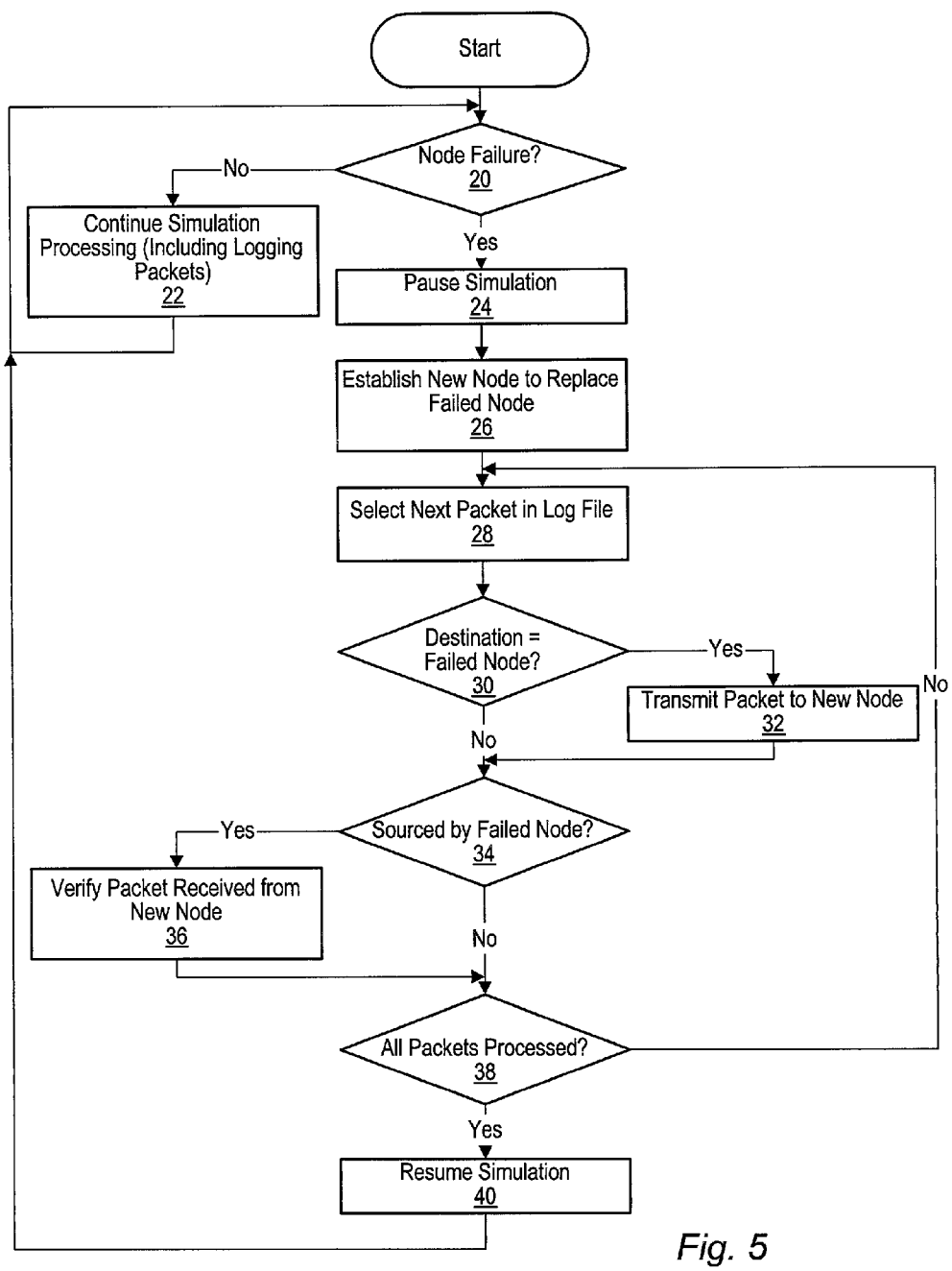
FIG. 5 is a flowchart illustrating one embodiment of recovery from a node failure using a log file.

Turning now to FIG. 5, a flowchart is shown illustrating operation of one embodiment of the distributed simulation system 1 0 during a simulation. Other embodiments are possible and contemplated. The blocks in FIG. 5 may represent instructions which, when executed, perform the function assigned to those blocks. While the blocks are shown in FIG. 5 in a particular order for ease of understanding, any order may be used in other embodiments.

If a node failure is not detected (decision block 20), the simulation processing may continue normally (block 22). The simulation processing may include the logging of message packets by whichever node or nodes is performing the logging. The detection of node failure may be handled in a variety of fashions. For example, if a first node is expecting a message packet from a second node, the first node may set a time out counter. If the time out counter expires without reception of the expected message packet, the second node may be regarded as failing. Alternatively, if the failure happens in a "graceful" fashion in which the failing node is able to detect that a failure is occurring, the failing node may report the failure prior to shutting down. In some communication mechanisms between nodes, it may be possible to detect that a message packet transmitted to a node did not arrive. In such cases, the node may be regarded as failing (particularly if repeated attempts to send the packet are unsuccessful).

If a node failure is detected (decision block 20), the distributed simulation system may pause the simulation (block 24). For example, in embodiments which include a hub, the hub may transmit a stop command to each node, and the nodes may acknowledge pausing, to accomplish block 24. The node controlling the recovery process may initiate the pause. For example, the hub may control the recovery, or another node (e.g. a DCN) may control the recovery. The node controlling the recovery is referred to herein as the "recovery node". If the recovery node is not the hub, the recovery node may transmit a command to the hub to cause the hub to transmit the stop commands to each node, or may transmit the stop commands itself. In hubless embodiments, the recovery node may transmit the stop commands itself.

The recovery node may establish a new node to replace the failing node (block 26). Generally, establishing the new node may include allocating simulation resources to the node (e.g. a computer system or portion thereof on which to simulate, allocating floating licenses for simulator software or other software used by the node, etc.) and connecting the node into the simulation.

The recovery node may generally scan through the log file or files to bring the new node up to a state consistent with the rest of the nodes in the simulation. The blocks 28-38 may represent scanning through the log file and communicating with the new node to bring the new node up to that state. The recovery node may select the first message packet in the log file (block 28). That is, the recovery node may begin its scan at the start of the log file. The recovery node may advance the simulation time in the new node to the simulation time at which the next message packet occurred in the simulation. If the message packet is transmitted to the failed node (i.e. the failed node is a destination node of the message packet) (decision block 30), the recovery node transmits the message packet to the new node (block 32). If the message packet is transmitted by the failed node (i.e. the failed node sourced the message packet) (decision block 34), the recovery node verifies that the packet is sourced by the new node (block 36). If the message packet is neither sourced by nor transmitted to the failed node, the recovery node may ignore the message packet. If all packets in the log file have not been processed (decision block 38), the recovery node selects the next packet in the log file (block 28). If all packets have been processed, (decision block 38), the new node has been brought to a state consistent with the rest of the distributed simulation. Accordingly, the recovery node may resume the simulation (block 40). Similar to the pause described above, the recovery node may cause the resuming of the simulation directly or indirectly through the hub, depending on the embodiment.

It is noted that checking to ensure that the new node sources packets in the same way that the failed node sourced packets may be optional. If checking is not desired, blocks 34 and 36 may be eliminated. It is further noted that, while the recovery node pauses the simulation and establishes the new node (blocks 24 and 26), in other embodiments the user of the distributed simulation system 10 may perform these blocks manually after being informed, through an interface to the distributed simulation system 10, that the node failure has been detected. For example, a DCN may be a user interface to the distributed simulation system 10. The user may also choose to end the simulation or take any other action, as desired.

The flowchart of FIG. 5 may represent operation of the hub 12E, for the embodiment of the distributed simulation system 10 shown in FIG. 1. Alternatively, the flowchart of FIG. 5 may represent a combination of the operation of the hub 12E and a recovery node or nodes, for embodiments similar to FIG. 1. For example, the hub 12E may perform blocks 20 and 22, and the remaining blocks may be performed by the recovery node or nodes. The hub 12E may perform blocks 24 and 40 in response to commands from the recovery node or nodes.

The flowchart of FIG. 5 may represent a combination of the operation of each node and the operation of recovery node or nodes, for embodiments similar to FIG. 2. For example, each node may participate in blocks 20 and 22, while the recovery node or nodes may perform blocks 24-40. The flowchart of FIG. 5 may also represent the operation of a logging DCN for the embodiment of FIG. 3 (blocks 20 and 22) and the operation of a recovery node or nodes (blocks 24-40).

Figure 6:
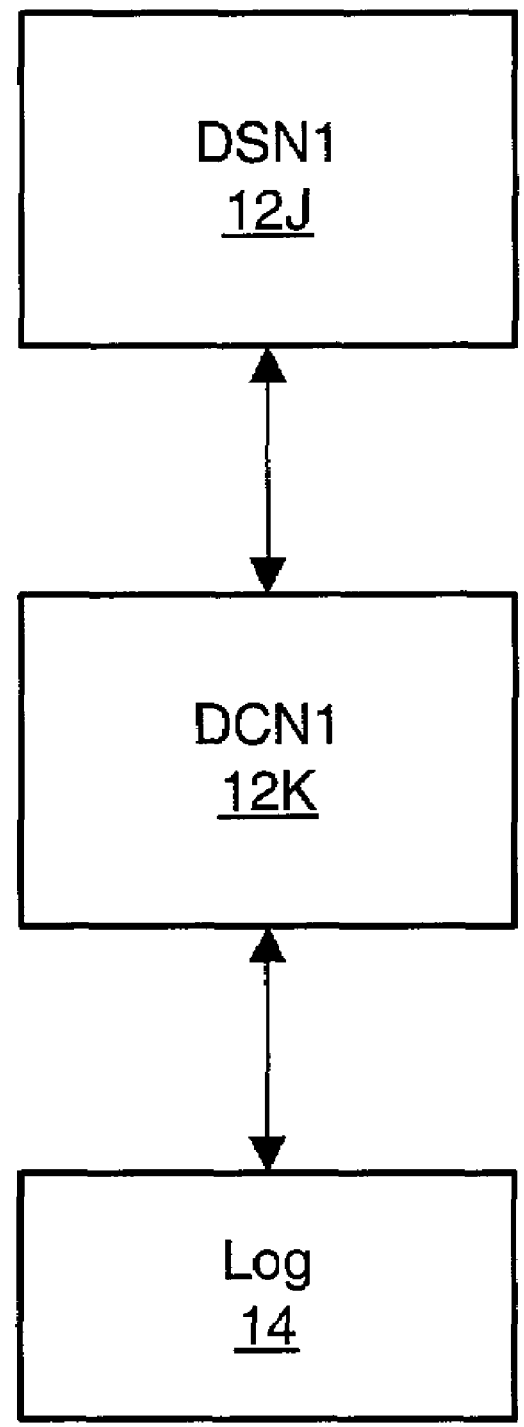
FIG. 6 is a block diagram illustrating one embodiment of a system for regressing a portion of a system under test previously simulated in a distributed simulation system.

Turning next to FIG. 6, an exemplary system 50 for regressing a portion of a system under test using a log file from the simulation of the system under test is shown. Other embodiments are possible and contemplated. In the embodiment of FIG. 6, the system 50 includes a DSN1 12J, a DCN1 12K coupled to the DSN1 12J, and the log file 14. The DSN1 12J may simulate a portion of the system under test from which the log file 14 was created. Other portions of the system under test are excluded from the system 50. Instead, the DCN1 12K may emulate the remaining portions of the system under test using the log file 14, to allow for regression testing of the DSN1 12J.

Generally, the DCN1 12K may read the message packets from the log file 14. The DCN1 12K may transmit, to the DSN1 12J, those message packets from the log file 14 which are destined for the portion of the system under test simulated by the DSN1 12J. Additionally, the DCN1 12K may detect message packets from the log file 14 which were transmitted by the portion of the system under test simulated by the DSN1 12J, and may verify that the DSN1 12J generates corresponding message packets.

While the embodiment of FIG. 6 includes a separate DCN for controlling the simulation, other embodiments may use instruction code on DSN1 to control the simulation and no DCN may be required.

Figure 7:
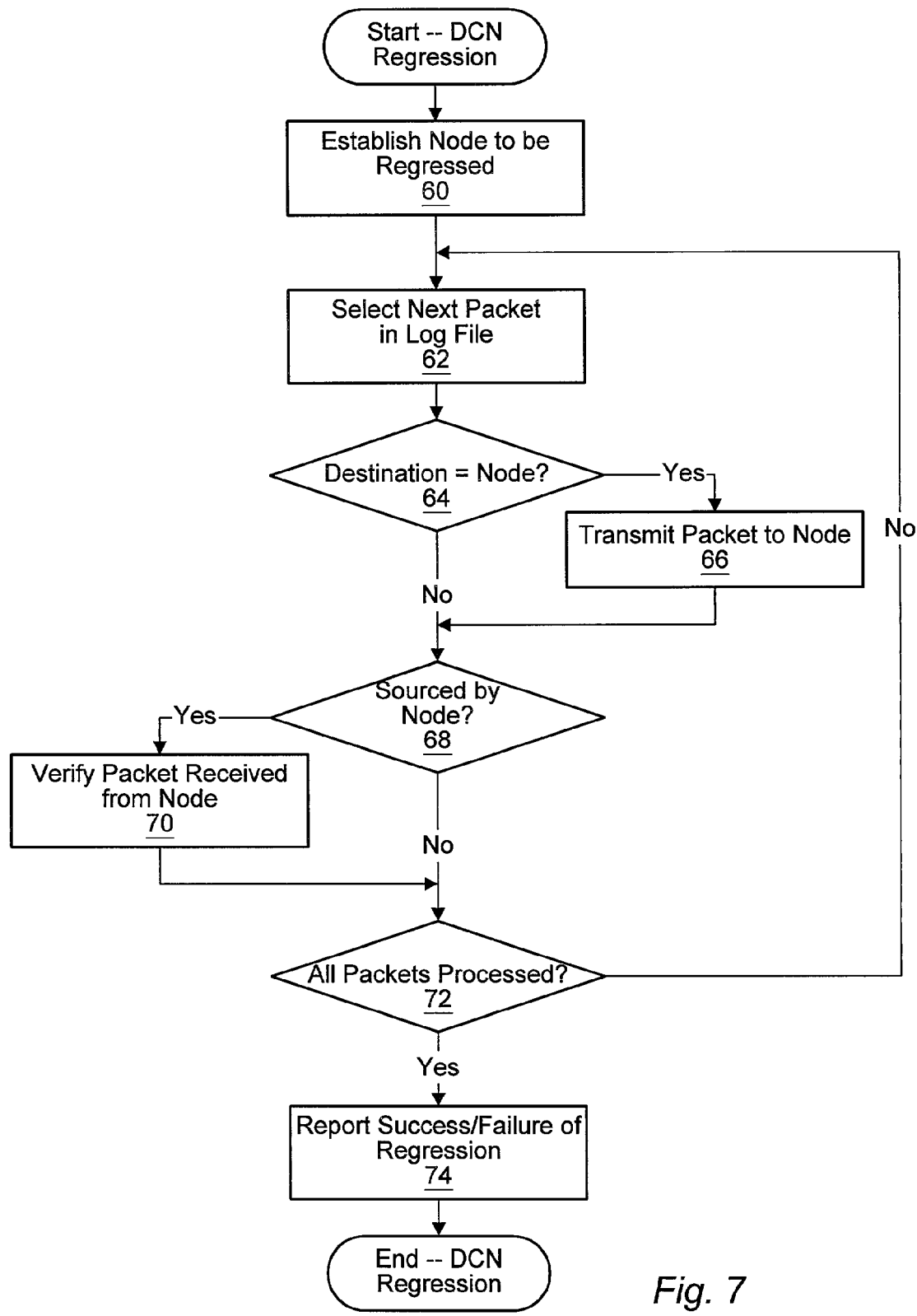
FIG. 7 is a flowchart illustrating operation of one embodiment of a distributed control node in the system of FIG. 6.

Turning now to FIG. 7, a flowchart is shown illustrating operation of one embodiment of the DCN1 12K during a simulation. Other embodiments are possible and contemplated. The blocks in FIG. 7 may represent instructions which, when executed, perform the function assigned to those blocks. While the blocks are shown in FIG. 7 in a particular order for ease of understanding, any order may be used in other embodiments.

The DCN1 12K may establish the node to be regressed (block 60). Similar to the establishment of a new node in FIG. 5, establishing the node to be regressed may include allocating simulation resources to the node (e.g. a computer system or portion thereof on which to simulate, allocating floating licenses for simulator software or other software used by the node, etc.) and connecting the node to the DCN1 12K.

The DCN1 12K may generally scan through the log file or files and communicate with the DSN1 12J, thereby emulating the rest of the system under test for the regression. The blocks 62-72 may represent scanning through the log file and communicating with the regressed node to perform the regression. The DCN1 12K may select the next message packet in the log file (block 62). The DCN1 12K may advance the simulation time in the regressed node to the simulation time at which the next message packet occurred in the simulation. If the message packet is to be transmitted to the regressed node (i.e. the regressed node is a destination node of the message packet) (decision block 64), the DCN1 12K transmits the message packet to the regressed node (block 66). If the message packet is to be transmitted by the regressed node (i.e. the regressed node sources the message packet) (decision block 68), the DCN1 12K verifies that the packet is sourced by the regressed node (block 70). If the packet is not sourced by the regressed node as expected, the DCN1 12K may note the failure for reporting at the end of the simulation (at the block 74 in FIG. 7). Alternatively, the DCN1 12K may end the simulation in response to the failure. If the message packet in the log file is neither sourced from nor transmitted to the regressed node, the DCN1 12K may ignore the message packet. If all packets in the log file have not been processed (decision block 72), the DCN1 12K selects the next packet in the log file (block 62). If all packets have been processed, (decision block 72), the regression is completed and the DCN1 12K reports the success or failure of the regression (block 74).

The simulators used in the DSNs of some embodiments of the distributed simulation system 10 may support a checkpoint feature. Generally, if the checkpoint feature is enabled, the simulator may periodically transfer the complete state of the simulation to a file. The simulator may also support commands to load the state from a checkpoint into the simulator. The distributed simulation system 10 may be designed to use checkpointing, particularly for recovery from a node failure. The checkpoint feature may be enabled in each of the simulators in the DSNs. If a node fails, the most recent checkpoint of the state for that node may be loaded into the new node during the recovery procedure. Only those message packets occurring after the checkpoint need be transmitted to the new node to complete bringing the node up to a state consistent with the other nodes in the simulation.

FIG. 8 is a block diagram of another embodiment of the log file 14. The log files 14A-14D and 14F-14I may be similar. Other embodiments are possible and contemplated. In the embodiment of FIG. 8, similar to the embodiment of FIG. 4, the log file 14 may include an entry for each message packet transmitted during the simulation. The entry may include a time stamp, which may identify the simulation time at which the message packet is transmitted. The entry may also include the message packet (Message Packet in FIG. 8), and may optionally include source node and/or destination node information for the message packet.

Additionally, the embodiment of FIG. 8 may include entries identifying checkpoints made by the simulators. Such entries may also include a time stamp, and may further include a checkpoint reference. The checkpoint reference may generally be any identifier for the checkpoint. For example, the checkpoint reference may be a keyword indicating that a checkpoint occurred, marking the spot in the log file 14 at which the checkpoint occurred for recovery purposes. Alternatively, the checkpoint reference may be a file name, or a path and file name, of the checkpoint data.

In other embodiments, a log file 14 similar to FIG. 4 may be used (with no indication of the checkpoint occurring therein). In such embodiments, the checkpoint may include enough information to determine which message packets in the log file 14 are subsequent to the checkpoint. For example, the checkpoint data may contain an indication of simulation time, and time stamps in the log file 14 indicating later simulation times may indicate message packets which occurred after the checkpoint.

Figure 9:
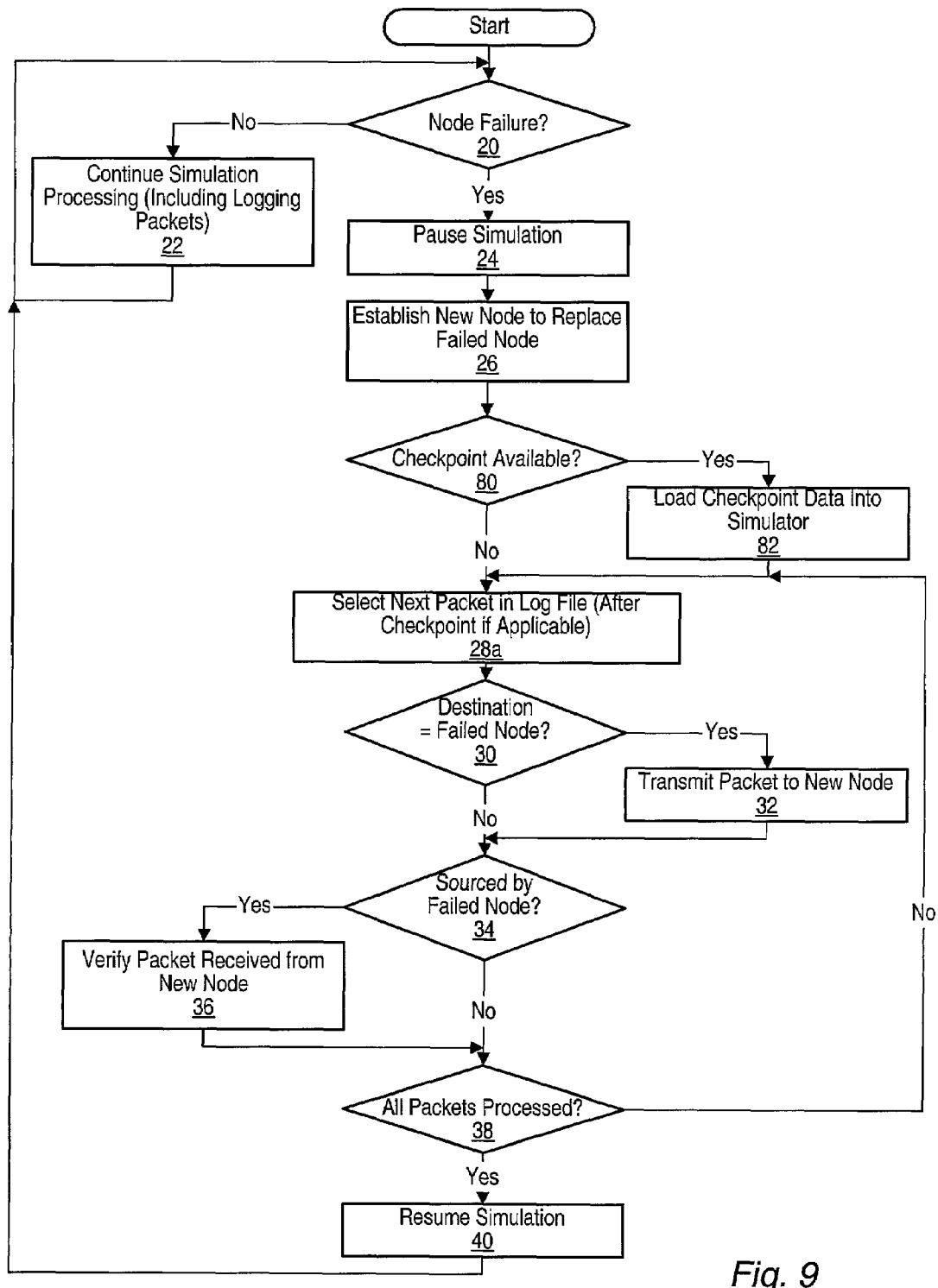
FIG. 9 is a flowchart illustrating one embodiment of recovery from a node failure using the second embodiment of the log file.

FIG. 9 is a flowchart similar to FIG. 5 which makes use of checkpoint data during the recovery from a node failure. Other embodiments are possible and contemplated. Like numbered blocks in FIGS. 5 and 9 are similar. The blocks in FIG. 9 may represent instructions which, when executed, perform the function assigned to those blocks. While the blocks are shown in FIG. 9 in a particular order for ease of understanding, any order may be used in other embodiments.

Generally, the embodiment represented in FIG. 9 may perform normal simulation processing (including logging message packets) if a node failure is not detected, and may pause the simulation and establish a new node to replace the failing node if a node failure is detected, similar to FIG. 5 (blocks 20-26). The recovery node may determine if a checkpoint is available (decision block 80). The recovery node may determine if a checkpoint is available by scanning the log file 14, if checkpoints are noted in the log file 14. Alternatively, the recovery node may search the storage used by the failed node for a checkpoint file. If a checkpoint is available, the recovery node may load the checkpoint data into the simulator in the new node (block 82), using the commands provided in the simulator for loading a checkpoint.

The recovery node may generally scan through the log file or files to bring the new node up to a state consistent with the other nodes, similar to FIG. 5 (blocks 28a-38). However, instead of starting at the beginning of the log file, the recovery node locates the first message packet subsequent to the checkpoint loaded into the new node. If the log file includes a reference to the checkpoint, the first message packet may be the next entry in the log file after the checkpoint. If no reference to the checkpoint is included in the log files, then the indication from the simulator as to the simulation time at the checkpoint may be used to determine the first packet in the log file or files which is to be selected. Once the log files have been processed, the recovery node may resume the simulation (block 40).

Figure 10:
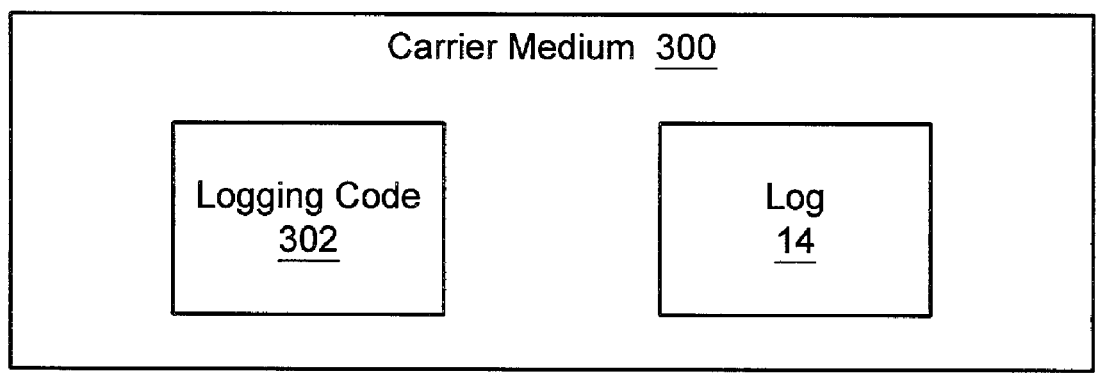
FIG. 10 is a block diagram of one embodiment of a carrier medium.

Turning next to FIG. 10, a block diagram of a carrier medium 300 is shown. Generally speaking, a carrier medium may include computer readable media such as storage media (which may include magnetic or optical media, e.g., disk or CD-ROM), volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

The carrier medium 300 is shown storing logging code 302 and the log file 14. The logging code 302 may represent one or more code sequences implementing one or more of the flowcharts shown in FIGS. 5, 7, and/or 9. The log file 14 may be the log file shown in FIGS. 1 and 3. Other embodiments may store the log files 14A-14D and 14F-14I for the embodiment of FIG. 2. The carrier medium 300 as illustrated in FIG. 10 may represent multiple carrier media in multiple computer systems on which the distributed simulation system 10 executes.

Numerous variations and modifications will become apparent to those skilled in the art once the above disclosure is fully appreciated. It is intended that the following claims be interpreted to embrace all such variations and modifications.

What is claimed is:

1. A distributed simulation system comprising:
two or more computer systems configured as a plurality of nodes arranged to perform a simulation of a system under test, wherein the plurality of nodes are configured to communicate simulation commands and signal values for the system under test using message packets transmitted between the plurality of nodes, and
at least one logging node of the plurality of nodes is configured to log the message packets in one or more log files on at least one non-volatile storage medium during the simulation, wherein the at least one logging node is separate from nodes targeted by the message packets, wherein the logging node is a distributed control node, and wherein one of the plurality of nodes is a hub, and wherein the hub is configured to route message packets to the distributed control node even if the message packets are not otherwise destined for the distributed control node.

2. The distributed simulation system as recited in claim 1 wherein, if a first node of the plurality of nodes fails during the simulation, the distributed simulation system is configured to establish a second node, and wherein a third node of the plurality of nodes is configured to read message packets that were transmitted to the first node from the log file and to transmit the message packets to the second node.

3. The distributed simulation system as recited in claim 2 wherein the distributed simulation system is configured to pause the simulation prior to transmitting the message packets to the second node, and wherein one of the plurality of nodes is configured to resume the simulation subsequent to transmitting the message packets from the log file to the second node.

4. The distributed simulation system as recited in claim 2 wherein the third node is further configured to detect message packets in the log file which were sourced by the first node, and wherein the third node is configured to verify that the second node transmits corresponding message packets.

5. The distributed simulation system as recited in claim 2 wherein the second node is configured to load a simulator state corresponding to a simulation checkpoint, and wherein the third node is configured to transmit, to the second node, message packets that were transmitted to the first node if the message packets occurred after the simulation checkpoint, and wherein the third node is configured not to transmit, to the second node, message packets that were transmitted to the first node if the message packets occurred prior to the simulation check point.

6. An apparatus comprising:
a first node configured to simulate a portion of a system under test; and
at least one computer readable medium storing instructions which, when executed, read first message packets from a log file, wherein the first message packets were transmitted to a previous node simulating the portion in a preceding simulation, and wherein the instructions, when executed, transmit the first message packets to the first node during the simulation, and wherein the instructions, when executed, read second message packets from the log file, wherein the second message packets were sourced by the previous node simulating the portion in the preceding simulation, and wherein the instructions, when executed, verify that the first node sources corresponding message packets during the simulation.

7. The apparatus as recited in claim 6 wherein the log file contains only the first message packets and the second message packets.

8. The apparatus as recited in claim 6 wherein the log file contains each message packet transmitted in the preceding simulation.

9. The apparatus as recited in claim 8 wherein the instructions, when executed, ignore message packets other than the first message packets and the second message packets in the log file.

10. The apparatus as recited in claim 6 wherein the simulation excludes other portions of the system under test.

11. The apparatus as recited in claim 6 wherein the instructions are executed in a second node coupled to the first node.

12. The apparatus as recited in claim 6 wherein the instructions are executed by the first node.

13. A method comprising:
performing a simulation of a system under test in a plurality of nodes of a distributed simulation system, the plurality of nodes configured to communicate simulation commands and signal values for the system under test using message packets transmitted between the plurality of nodes; and
logging the message packets in one or more log files on at least one non-volatile storage medium during the simulation by at least one logging node of the plurality of nodes, wherein the at least one logging node is separate from nodes targeted by the message packets, wherein the logging node is a distributed control node, and wherein one of the plurality of nodes is a hub, the method further comprising the hub routing message packets to the distributed control node even if the message packets are not otherwise destined for the distributed control node.

14. The method as recited in claim 13 further comprising:
a first node of the plurality of nodes failing during the simulation;
establishing a second node responsive to the failing; and
transmitting message packets to the second node that were transmitted to the first node, the message packets read from the log file.

15. The method as recited in claim 14 further comprising:
pausing the simulation prior to transmitting the message packets to the second node; and
resuming the simulation subsequent to transmitting the message packets from the log file to the second node.

16. The method as recited in claim 14 further comprising:
detecting message packets in the log file which were sourced by the first node; and
verifying that the second node transmits corresponding message packets.

17. The method as recited in claim 14 further comprising the second node loading a simulator state corresponding to a simulation checkpoint, and wherein transmitting message packets to the second node comprises transmitting, to the second node, message packets that were transmitted to the first node if the message packets occurred after the simulation checkpoint, and not transmitting, to the second node, message packets that were transmitted to the first node if the message packets occurred prior to the simulation check point.

18. A method comprising:
performing a simulation of a system under test in a plurality of nodes of a distributed simulation system, the plurality of nodes configured to communicate simulation commands and signal values for the system under test using message packets transmitted between the plurality of nodes;
logging the message packets in one or more log files on at least one non-volatile storage medium during the simulation by at least one logging node of the plurality of nodes, wherein the at least one logging node is separate from nodes targeted by the message packets;
reading message packets from the log file which were transmitted to a node simulating a first portion of the system under test during the simulation for transmission to a first node simulating a portion of the system under test in a second simulation including the portion and excluding other portions of the system under test; and
transmitting the message packets to the first node.

19. The method as recited in claim 18 further comprising:
reading message packets from the log file which were transmitted by the node simulating the first portion of the system under test during the simulation, the reading performed during the second simulation including the first portion of the system under test and excluding other portions of the system under test; and
verifying the message packets are transmitted by the first node simulating the first portion in the second simulation.

20. One or more computer readable media storing instructions which, when executed on a logging node separate from simulation nodes in a distributed simulation system:
log, in one or more log files on at least one non-volatile storage medium, message packets transmitted during a simulation between a plurality of simulation nodes forming the distributed simulation system, the message packets communicating simulation commands and signal values for a system under test being simulated in the simulation;
read message packets from the log file which were transmitted to a node simulating a first portion of the system under test during the simulation for transmission to a first node simulating a portion of the system under test in a second simulation including the portion and excluding other portions of the system under test; and
transmit the message packets to the first node.

21. The computer readable media as recited in claim 20 further comprising instructions which, when executed, establish a second node responsive to a first node of the plurality of nodes failing during the simulation, and wherein the instructions, when executed, transmit message packets to the second node that were transmitted to the first node, the message packets read from the log file.

22. The computer readable media as recited in claim 21 further comprising instructions which, when executed, pause the simulation prior to transmitting the message packets to the second node, and resume the simulation subsequent to transmitting the message packets from the log file to the second node.

23. The computer readable media as recited in claim 21 further comprising instructions which, when executed, detect message packets in the log file which were sourced by the first node, and verify that the second node transmits corresponding message packets.

24. The computer readable media as recited in claim 21 further comprising instructions which, when executed, load a simulator state corresponding to a simulation checkpoint into the second node, and wherein transmitting message packets to the second node comprises transmitting, to the second node, message packets that were transmitted to the first node if the message packets occurred after the simulation checkpoint, and not transmitting, to the second node, message packets that were transmitted to the first node if the message packets occurred prior to the simulation check point.

25. The computer readable media as recited in claim 20 further comprising instructions which, when executed:
   read message packets from the log file which were transmitted by the node simulating the first portion of the system under test during the simulation, the reading performed during the second simulation including the first portion of the system under test and excluding other portions of the system under test; and
   verify the message packets are transmitted by the first node simulating the first portion in the second simulation.

* * * * *